(12) United States Patent
Yamamoto et al.

(10) Patent No.: US 11,362,571 B2
(45) Date of Patent: Jun. 14, 2022

(54) ELECTRONIC APPARATUS

(71) Applicant: DENSO CORPORATION, Kariya (JP)

(72) Inventors: Toshihisa Yamamoto, Kariya (JP); Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 187 days.

(21) Appl. No.: 16/874,648

(22) Filed: May 14, 2020

(65) Prior Publication Data

US 2020/0366165 A1 Nov. 19, 2020

(30) Foreign Application Priority Data

May 17, 2019 (JP) .............................. JP2019-093617

(51) Int. Cl.
| | |
|---|---|
| *H05K 1/18* | (2006.01) |
| *H02K 11/33* | (2016.01) |
| *H02K 3/50* | (2006.01) |
| *H02K 11/40* | (2016.01) |
| *B62D 5/04* | (2006.01) |
| *H05K 1/02* | (2006.01) |

(52) U.S. Cl.
CPC ........... *H02K 11/33* (2016.01); *B62D 5/0406* (2013.01); *B62D 5/046* (2013.01); *H02K 3/50* (2013.01); *H02K 11/40* (2016.01); *H05K 1/02* (2013.01); *H05K 1/18* (2013.01); *H05K 1/181* (2013.01); *H05K 1/182* (2013.01); *H05K 1/183* (2013.01); *H05K 1/184* (2013.01); *H05K 1/185* (2013.01); *H02K 2211/03* (2013.01); *H05K 2201/1009* (2013.01)

(58) Field of Classification Search
CPC .......... H02K 11/33; H02K 11/40; H02K 3/50; H02K 2211/03; B62D 5/0406; B62D 5/046; H05K 1/02; H05K 1/18; H05K 1/181; H05K 1/182; H05K 1/183; H05K 1/184; H05K 1/185; H05K 2201/1009
See application file for complete search history.

(56) References Cited

U.S. PATENT DOCUMENTS

| | | | |
|---|---|---|---|
| 2003/0080819 A1* | 5/2003 | Jiles | .................. H03L 1/025 331/176 |
| 2008/0080151 A1* | 4/2008 | Shimizu | ............... H05K 3/4046 361/760 |
| 2016/0094175 A1 | 3/2016 | Yamasaki | |

FOREIGN PATENT DOCUMENTS

| | | |
|---|---|---|
| JP | H8-267399 A | 10/1996 |
| JP | 2016-225395 A | 12/2016 |
| JP | 2019-021605 A | 2/2019 |

* cited by examiner

*Primary Examiner* — Binh B Tran
(74) *Attorney, Agent, or Firm* — Maschoff Brennan

(57) ABSTRACT

An electronic apparatus includes a wiring board. The wiring board includes a wiring and a through-hole and is provided by dividing a multi-board providing board into the wiring board. The electronic apparatus further includes a circuit component having a surface mounting structure, mounted to the wiring board, and electrically connected to the wiring. A side wall of the wiring board has a cut portion that is provided when cutting and dividing the multi-board providing board. In the wiring board, the through-hole is formed adjacent to the cut portion without arranging the circuit component between the cut portion and the through-hole.

5 Claims, 7 Drawing Sheets

ELECTRONIC APPARATUS

CROSS-REFERENCE TO RELATED APPLICATION

The present application is based on Japanese Patent Application No. 2019-093617 filed on May 17, 2019, disclosure of which is incorporated herein by reference.

TECHNICAL FIELD

The present disclosure relates to an electronic apparatus.

BACKGROUND

In an existing technology, a printed board formed with a plurality of circuits is divided at a division scheduled line.

SUMMARY

The present disclosure provide an electronic apparatus that has a large effective mounting area in a wiring board.

In an aspect of the present disclosure, an electronic apparatus comprises a wiring board provided by dividing a multi-board providing board into the wiring board. The electronic apparatus further comprises a circuit component having a surface mounting structure, mounted to the wiring board, and electrically connected to a wiring of the wiring board. A side wall of the wiring board has a cut portion that is provided when cutting and dividing the multi-board providing board. In the wiring board, a through-hole is formed adjacent to the cut portion without arranging the circuit component between the cut portion and the through-hole.

BRIEF DESCRIPTION OF THE DRAWINGS

Objects, features and advantages of the present disclosure will become more apparent from the following detailed description made with reference to the accompanying drawings, in which.

DETAILED DESCRIPTION

Now, description will be given on related art which does not necessarily constitute the prior art. It is conceivable to provide an electronic apparatus having such a configuration that a circuit component having a surface mounting structure is mounted to a wiring board that is provided by dividing a multi-board-providing board into a plurality of boards. However, in the case of a wiring board provided by dividing the multi-board providing board, stress may be applied in cutting the multi-board providing board, and a region near a cut portion of the wiring board may be deformed. For this reason, in cases where the circuit component having the surface mounting structure is mounted to the deformation region of the wiring board by a connection member such solder, cracks may generate in the connection member and/or the electronic component itself may have a failure. This causes such a difficulty that an effective mounting area in the wiring board is small in the electronic apparatus.

In view of the foregoing, an embodiment of the present disclosure provides an electronic apparatus that has a large effective mounting area in a wiring board.

In an embodiment of the present disclosure, an electronic apparatus comprises a wiring board, the wiring board including: a base member having an electrically insulating property and having a front surface and a back surface; a wiring having an electrically conductive property and arranged to the base member; and at least one through-hole penetrating from the front surface to the back surface of the base member, wherein part of the wiring is arranged to the through-hole, wherein the wiring board is provided by dividing a multi-board providing board into the wiring board. The electronic apparatus further comprises a circuit component having a surface mounting structure, mounted to the wiring board, and electrically connected to the wiring. A side wall of the wiring board has a cut portion that is provided when cutting and dividing the multi-board providing board. In the wiring board, the through-hole is formed adjacent to the cut portion without arranging the circuit component between the cut portion and the through-hole.

In the above example, the through-hole is formed adjacent to the cut portion without arranging the circuit component between the through-hole and the cut portion. Specifically, the through-hole is formed in a portion where stress is likely applied when dividing the multi-board providing board into the wiring board.

Therefore, in a portion where the stress due to the dividing is likely to be applied, that is, in a portion where it is difficult to mount the circuit component having the surface mounting structure, it is possible to insert an insertion terminal of a circuit component having an insertion mounting structure into the through-hole and to electrically connect to the wiring. It is possible to insert an insertion terminal of an external device having an insertion mounting structure into a through-hole and to electrically connect to the wiring at a portion where it is difficult to mount a circuit component having a surface mounting structure.

A connection structure in which this terminal is inserted into the through-hole to make the connection has a larger stress tolerance with respect to the stress of the wiring board than a connection structure of the circuit component of the surface mounting structure. Therefore, it is possible to effectively use a portion where it is difficult to mount the circuit component having the surface mounting structure, and it is possible to provide a large effective mounting area of the wiring board.

Embodiments will be specifically described with reference to the drawings. In a respective embodiment specifically described below, portions corresponding to those described in the preceding embodiment are denoted by the same or similar reference signs to avoid redundant description. In a respective embodiment, when only part of a configuration is described, description of the preceding embodiment is applied to the other part of the configuration. In the below, three directions orthogonal to each other are referred to as an X direction, a Y direction, and a Z direction.

Embodiment

An electric power steering apparatus 100 according to the present embodiment will be described with reference to FIGS. 1 to 7. As an example of an electronic control unit of the present disclosure, the present embodiment employs an ECU 10 applied to the electric power steering apparatus 100. However, the present disclosure is not limited to this example, and is applicable to an apparatus other than the electric power steering apparatus 100.

Figure 7:
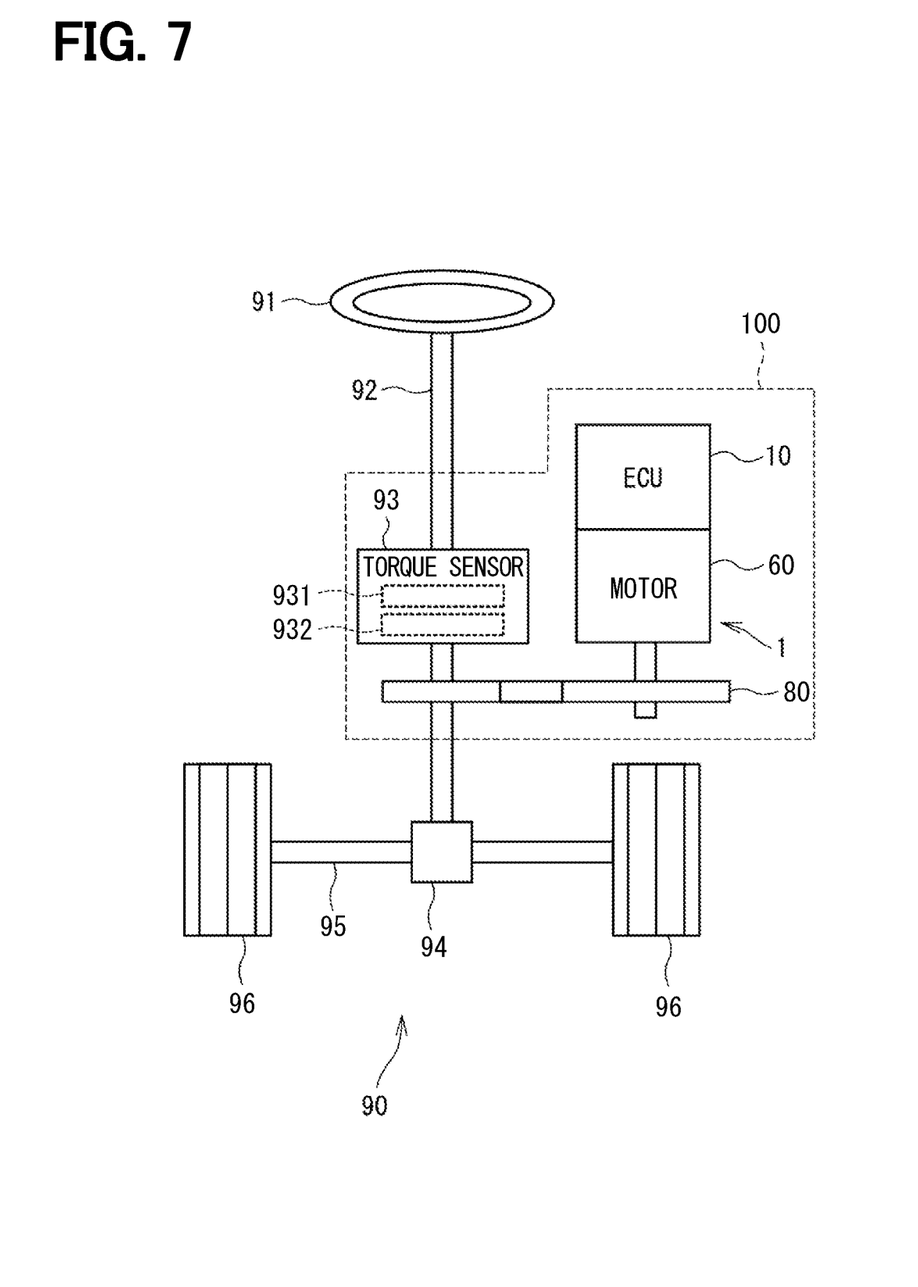
FIG. 7 is a diagram illustrating a schematic configuration of a steering system according to an embodiment.

First, the electric power steering apparatus 100 and its overall configuration will be described with reference to FIG. 7. The electric power steering apparatus 100 is applied to a steering system 90 of a vehicle. The steering system 90 includes a steering wheel 91, a steering shaft 92, a pinion gear 94, a rack shaft 95, tire wheels 96, and the electric power steering apparatus 100.

The steering wheel 91 is connected to the steering shaft 92. The pinion gear 94 is provide at a tip of the steering shaft 92. The pinion gear 94 is engaged with the rack shaft 95. A pair of tire wheels 96 are connected to both ends of the rack shaft 95 via tie rods or the like.

In the steering system 90, in response to the driver rotating the steering wheel 91, the steering shaft 92 connected to the steering wheel 91 rotates. In the steering system 90, rotational motion of the steering shaft 92 is converted into a linear motion of the rack shaft 95 by the pinion gear 94. As a result, the pair of tire wheels 96 are steered at an angle corresponding to an amount of displacement of the rack shaft 95.

The electric power steering apparatus 100 has a function of assisting the rotation of the steering wheel 91. The electric power steering apparatus 100 includes a torque sensor 93, a reducer gear 80, and a drive device 1. The drive device 1 includes a motor 60 and the ECU 10.

The torque sensor 93 has a function of detecting a steering torque of the steering shaft 92. The present embodiment employs the torque sensor 93 that have two detection units, which are a first torque detection unit 931 and a second torque detection unit 932 to provide two systems. However, the present disclosure is not limited to this example. For example, the torque sensor 93 having only one detection unit providing one system may be employed.

The torque sensor 93 is electrically connected to the ECU 10. The torque sensor 93 outputs an electric signal corresponding to the steering torque to the ECU 10. Therefore, the ECU 10 can acquire the electric signal corresponding to the steering torque from the torque sensor 93. The ECU 10 controls driving of the motor 60 based on the steering torque detected by the torque sensor 93 and signals input from various ECUs mounted to the vehicle.

The motor 60 is connected to the reducer gear 80 via a belt (not shown). Speed of the rotation of the motor 60 is reduced at the reducer gear 80 and is transmitted to the steering shaft 92. With this configuration, the electric power steering apparatus 100 can assist the rotation (steering) of the steering wheel 91.

As described above, the electric power steering apparatus 100 employed may be of a column assist type in which an assist force for assisting steering is applied to the steering shaft 92, for example. However, the electric power steering apparatus 100 is not limited to the above configuration. The electric power steering apparatus 100 may be of a rack assist type in which an assist force is applied to the rack shaft 95, or a pinion assist type in which an assist force is applied to the pinion gear 94.

Figure 2:
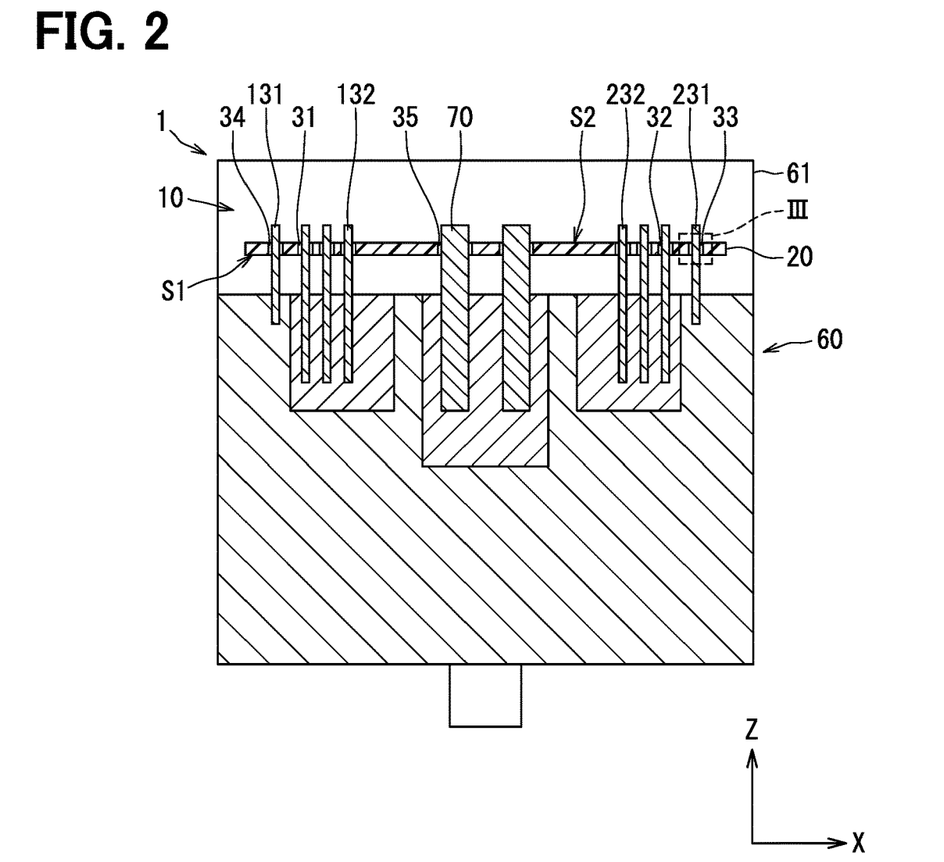
FIG. 2 is a cross-sectional view taken along the line II-II of FIG. 1.

Next, the drive device 1 will be described. As described above, the drive device 1 includes the motor 60 and the ECU 10. As shown in FIG. 2, the motor 60 and the ECU 10 are integrally connected in such a manner that the motor 60 and the ECU 10 line up in the Z direction. Specifically, the ECU 10 is mounted above the motor 60 in the Z direction. Therefore, the drive device 1 has so-called an electric-and-mechanical integrated configuration.

The motor 60 includes well-known motor components such as a motor shaft, a rotor, and a stator, and further includes a housing 61 that houses the motor components. The housing 61 has, for example, a cylindrical shape. The housing 61 houses the ECU 10 in addition to the motor components.

As an example, the present embodiment employs a motor 60 having two systems of windings (stator coils) of the stator. Therefore, the motor 60 includes stator coils for the first system and stator coils for the second system. Each of the winding sets of the two systems includes three-phase stator coils of a U-phase, a V-phase, and a W-phase constituting a brushless motor.

The motor 60 is provided with six motor-associated terminals 131 and 231 for supplying three-phase alternating currents to the three-phase stator coils of the two systems. The six motor-associated terminals 131 and 231 extend in the Z direction from the housing 61 toward the ECU 10. The first motor-associated terminals 131 are connected to the stator coils for the first system. The second motor-associated terminals 231 are connected to the stator coils for the second system. The motor-associated terminals 131 and 231 correspond to motor terminals and winding terminals. Note that the present disclosure is not limited to this example, and is applicable even to a motor 60 having only one stator coil set.

The motor-associated terminals 131 and 231 are provided to protrude from the motor components. The motor-associated terminals 131 and 231 are electrically and mechanically connected (hereinafter simply connected) to the wiring of the wiring board 20. This connection structure will be described later in detail. In the motor 60, one end of the motor shaft protrudes from an region of the motor 69 surrounding the motor shaft. The protruding one end of the motor shaft of the motor 60 is connected to the reducer gear 80 via a belt. The motor-associated terminals can also be called motor wires.

In the drive device 1, a connector including a first signal-associated terminal 132, a second signal-associated terminal 232, and a power supply-associated terminal 70 is attached to the housing 61, for example. The first signal-associated terminal 132, the second signal-associated terminal 232, and the power supply-associated terminal 70 are integrally provided to a connector case formed of resin or the like. Specifically, the connector includes the first signal-associated terminal 132, the second signal-associated terminal 232, the power system-associated terminal 70, and the connector case. The connector is mounted to the wiring board 20 such that the terminals 132, 232, 70 are inserted into the through-holes 31, 32, 35 and connected to the wiring 22. Each terminal 131, 231, 132, 232, 70 corresponds to an insertion terminal. The wiring board 20 will be described later in detail.

The connector can be regarded as a single external device. Further, since the first signal-associated terminal 132, the second signal-associated terminal 232, and the power supply-associated terminal 70 are inserted into the through-holes 31, 32, and 35, the connector can be regarded as a through-hole device. The through-hole device can be regard also as a through-hole component and also as an electronic component having an insertion mounting structure.

The first signal-associated terminal 132, the second signal-associated terminal 232, and the power supply-associated terminal 70 may be configured as different connectors. In this case, a first signal connector includes the first signal-associated terminal 132 and a first connector housing to which the first signal-associated terminal 132 is attached. Similarly, a second signal connector includes the second signal-associated terminal 232 and a second connector housing to which the second signal-associated terminal 232 is attached. A power supply connector includes the power supply-associated terminal 70 and a power supply connector housing to which the power supply-associated terminal 70 is attached. Therefore, the first signal connector, the second signal connector, and the power supply connector can be regarded as external devices having the insertion mounting structure.

The first signal-associated terminal 132 is a terminal for the first system. The second signal-associated terminal 232 is a terminal for the second system. In the present embodiment, eight terminals are provided as the first signal-associated terminal 132 and eight terminals are provided as the second signal-associated terminal 232. In the present embodiment, two terminals which are a power supply terminal and a ground terminal are provided as the power supply-associated terminal 70. However, the number of terminals of the first signal-associated terminal 132 and the second signal-associated terminal 232 is not limited to the above examples.

Figure 1:
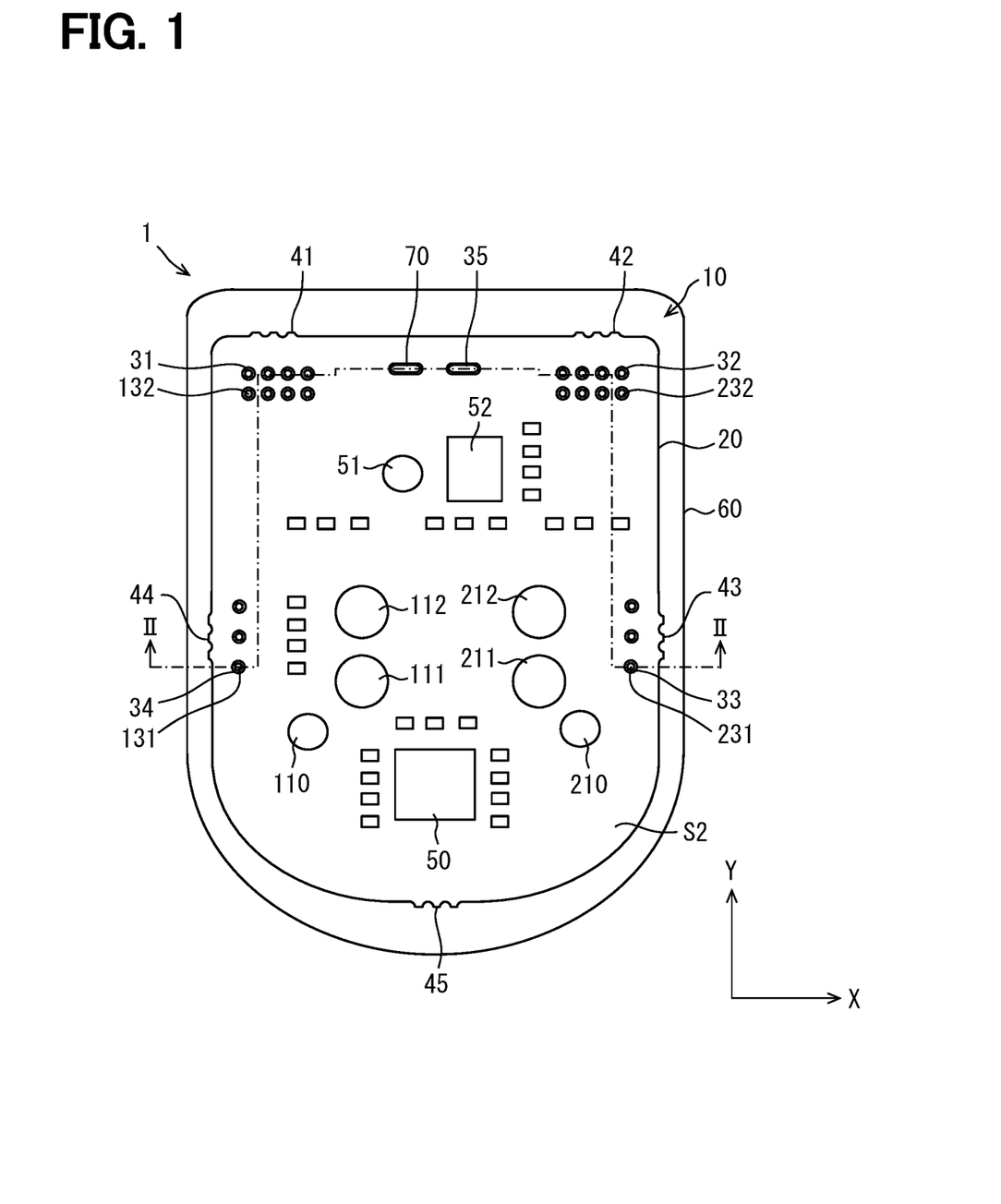
FIG. 1 is a plan view illustrating a schematic configuration of an electronic control unit according to an embodiment.

Now, the ECU 10 will be described. The ECU 10 includes a wiring board 20 and various circuit components such as a shared CPU 50 mounted to the wiring board 20. FIG. 1 illustrates the wiring board 20 that is provided by dividing a multi-board providing board 300 and that is mounted with the motor 60. On the other hand, FIGS. 4 and 5 illustrate the wiring board 20 before the dividing of the multi-board providing board 300.

The various circuit components are mounted to the wiring board 20 to constitute: a drive circuit for driving the motor 60; and the like. Specifically, in the ECU 10, the drive circuit for driving the motor 60 and the like are configured by the wiring board 20 and various circuit components. The various circuit components are mounted to the wiring board 20 to constitute drive circuits, which drive circuits are provided for the plurality of stator coil sets, respectively. In the present embodiment, the ECU 10 having a partially redundant configuration is employed.

The circuit components mounted to the wiring board 20 include circuit components shared by the first system and the second system. The shared circuit components include a shared CPU 50, a shared capacitor 51, a shared coil 52, a shared ASIC 53. These circuit components 50 to 53 are connected to the wiring 22 of the wiring board 20. As the CPU 50, a shared microcomputer or the like may be employed. As the shared capacitor 51, an aluminum electrolytic capacitor or the like may be employed.

Figure 4:
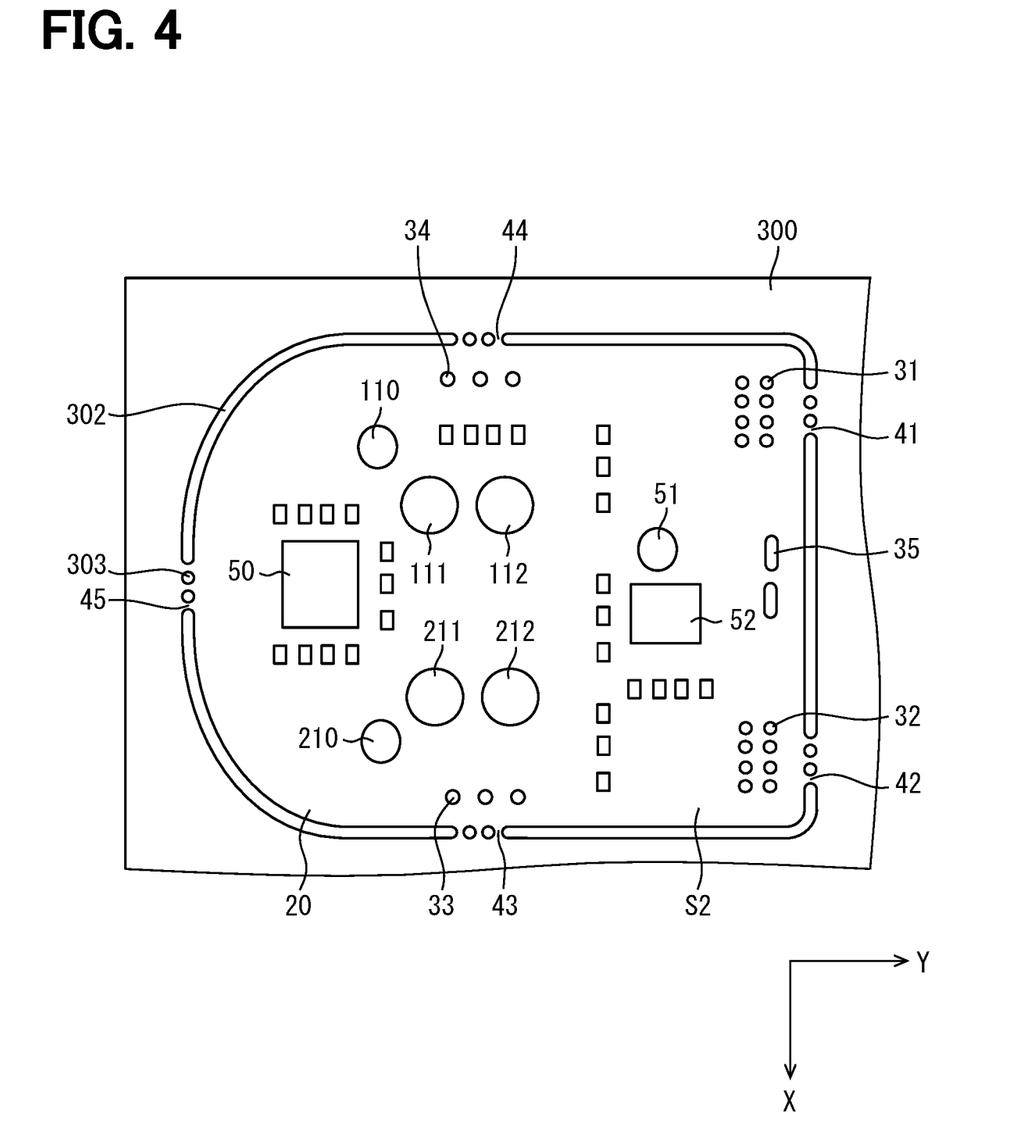
FIG. 4 is a plan view illustrating a schematic configuration of a front surface side of a wiring board according to an embodiment.
Figure 5:
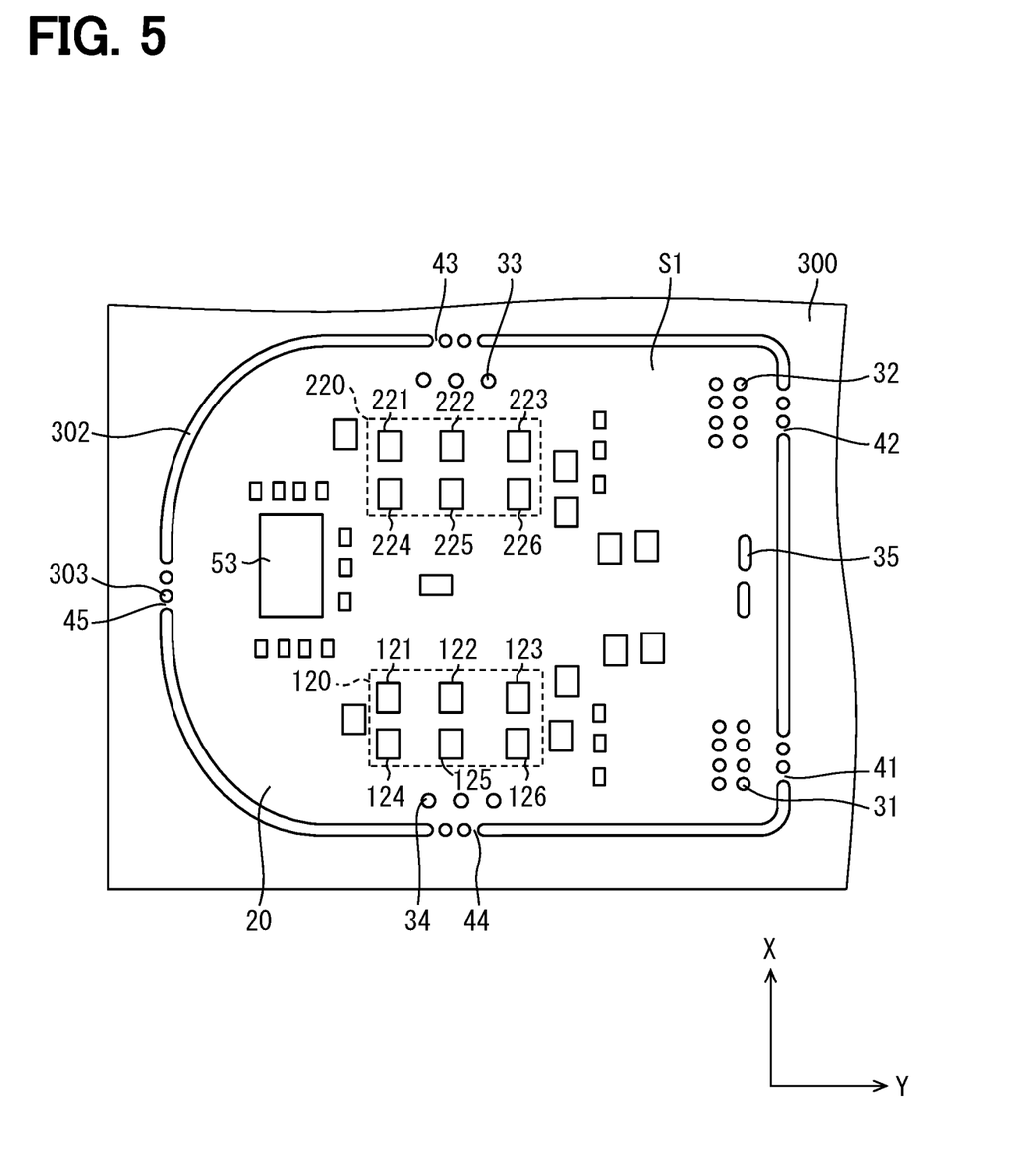
FIG. 5 is a plan view illustrating a schematic configuration of a back surface side of a wiring board of an embodiment.

As shown in FIG. 4, the shared CPU 50, the shared capacitor 51, and the shared coil 52 are mounted to a cover-side surface S2 of the wiring board 20. The shared ASIC 53 is mounted to a motor-side surface S1 of the wiring board 20, as shown in FIG. 5. The wiring board 20 will be described later in detail.

As shown in FIGS. 1 and 4, first capacitors 110, 111, and 112 serving as circuit components for the first system and second capacitors 210, 211 and 212 serving as circuit components for the second system are mounted to the wiring board 20. The first capacitors 110 to 112 and the second capacitors 210 to 212 are connected to the wiring 22 of the wiring board 20. As the first capacitors 110 to 112 and the second capacitors 210 to 212, aluminum electrolytic capacitors or the like can be adopted. The first capacitors 110 to 112 and the second capacitors 210 to 212 are mounted to the cover-side surface S2.

Further, as shown in FIG. 5, six first switching elements 121, 122, 123, 124, 125, 126 which serve as circuit components for the first system and which constitute a first inverter 120 are mounted to the wiring board 20. Six second switching elements 221, 222, 223, 224, 225, 226 which serve as circuit components for the second system and which constitute a second inverter 220 are mounted to the wiring board 20. The first switching elements 121 to 126 and the second switching elements 221 to 226 are connected to the wiring of the wiring board 20. As the first switching elements 121 to 126 and the second switching elements 221 to 226, MOSFETs, IGBTs or the like can be employed. The first switching elements 121 to 126 and the second switching elements 221 to 226 are mounted to the motor-side surface S1.

In the ECU 10, the first capacitors 110 to 112 and the first switching elements 121 to 126 are mounted to the wiring board 20, and constitute a drive circuit of the first system. In the ECU 10, the second capacitors 210 to 212 and the second switching elements 221 to 226 are mounted to the wiring board 20 and constitute a drive circuit of the second system.

These circuit components have, for example, a surface mounting structure. However, the present disclosure is not limited to this example, and is applicable to a through-hole device. Further, the wiring board 20 may include a circuit component (such as a resistance element) other than the above-described circuit components. Furthermore, the mounting surface of a respective circuit component is not limited to the above examples.

As shown in FIGS. 1 to 5, the wiring board 20 includes a base member 21, a wiring 22 formed in the base member 21, a plurality of through-holes 31 to 35 formed in the base member 21, and the like. The wiring board 20 is provided by dividing the multi-board providing board 300. The multi-board providing board 300 will be described later in detail.

Figure 3:
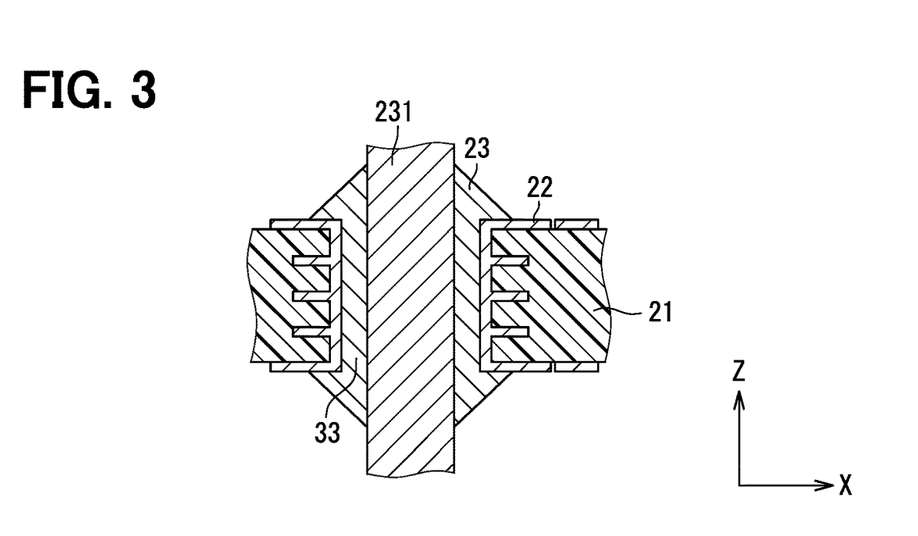
FIG. 3 is an enlarged view of the portion III in FIG. 2.

As shown in FIG. 3, an example of the wiring board 20 is a multilayer board in which a plurality of wirings 22 are stacked via the base member 21. However, the present disclosure is not limited to this example as long as the wiring board 20 includes the base member 21, the wiring 22, and the through-hole 31 to 35. The wiring 22 includes a power supply pattern, a ground pattern, a signal pattern, and the like.

A material of the base member 21 is, for example, an electrically insulating material such as epoxy resin. A material of the wiring 22 is, for example, an electrically conductive material such as copper.

In the present embodiment, through-holes formed in the wiring board 20 include five through-holes 31 to 35, which are a first through-hole 31, a second through-hole 32, a third through-hole 33, a fourth thorough-hole 34 and a fifth through-hole 35. As shown in FIGS. 2 and 3, each of the through-holes 31 to 35 penetrates from the front surface of the base member 21 to the back surface of the base member 21. Part of the wiring 22 is disposed in each through-hole 31 to 35. Each of the through-holes 31 to 35 corresponds to a through-hole. Each of the through-holes 31 to 35 is provided at an edge portion of a wiring board 200.

The wiring board 20 is attached to the motor 60 such that one of the front surface and the back surface faces the motor 60 and the other of the front surface and the back surface faces the housing 61. Therefore, in the wiring board 20, the surface facing the motor 60 among the front surface and the rear surface is called the motor-side surface S1, and the surface facing the housing 61 among the front surface and the rear surface is called the cover-side surface S2.

A connection structure between the second motor-associated terminal 231 and the third through-hole 33 is illustrated in FIG. 3. Other terminals and through-holes may have the same connection structure as that illustrated in FIG. 3.

The first through-hole 31 is provided for the first signal-associated terminal 132 for the first system. The first signal-associated terminal 132 is inserted into the first through-hole 31. The wiring 22 and the first signal-associated terminal 132 are connected to each other via solder 23. Through-hole formed in the wiring board 20 include, for example, eight first through-holes 31. The first through-holes 31 can be said to be a first through-hole group 31. The other through-holes 32 to 35 can be said to be through-hole groups 32 to 35, respectively.

In the present embodiment, the first through-holes 31 are collectively arranged at a corner of the wiring board 20 as an example arrangement. In the wiring board 20, the first through-holes 31 are arranged in the X direction and the Y direction. Specifically, in the wiring board 20, four first through-holes 31 are arranged in the X direction, and two first through-holes 31 are arranged in the Y direction.

In the present embodiment, the solder 23 is employed as an example of a conductive connection member that connects the wiring 22 and the first signal-associated terminal 132. However, the present disclosure is not limited to this example. Silver paste or the like may be adopted for the connection member, for example. The same is applicable to connection structures between other wirings 22 and the terminals.

The second through-hole 32 is provided for the second signal-associated terminal 232 for the second system. The second signal-associated terminal 232 is inserted into the second through-hole 32. The wiring 22 and the second signal-associated terminal 232 are connected to each other. The number of second through-holes 32 is the same as the number of first through-holes 31. The second through-holes 32 may be arranged in the same manner as the first through-holes 31. However, the second through-holes 32 are arranged at a different corner of the wiring board 20 than the first through-hole 31. The first through-holes 31 and the second through-holes 32 are provided at positions that are line-symmetric with respect to a center line extending in the Y direction on the XY plane of the wiring board 20.

The third through-holes 33 are provided for the second motor-associated terminals 231 for the second system. Specifically, the third through-holes 33 are provided corresponding to the three second motor-associated terminals 231 which are a U-phase terminal, a V-phase terminal, and a W-phase terminal of the stator coils of the second system. Therefore, the three third through-holes 33 are provided in the wiring board 20. A respective second motor-associated terminal 231 is inserted into the corresponding third through-hole 33, and the wiring 22 and the second motor-associated terminal 231 are connected to each other.

The present embodiment employs an arrangement example in which the third through-holes 33 are collectively arranged along the side wall of the wiring board 20. In the wiring board 20, the three third through-holes 33 are arranged in the Y direction.

The fourth through-holes 34 are provided for the first motor-associated terminals 131 for the first system. A respective first motor-associated terminal 131 is inserted into the corresponding fourth through-holes 34, and the wiring 22 and the first motor-associated terminal 131 are connected to each other. The number of fourth through-holes 34 is the same as the number of third through-holes 33. The fourth through-holes 34 are arranged in the same way as the third through-holes 33. The third through-hole 33 and the fourth through-hole 34 are provided at positions that are line-symmetric with respect to a center line extending in the Y direction on the XY plane of the wiring board 20.

In the above-described manner, the motor 60 is provided with the first motor-associated terminal 131 and the second motor-associated terminal 231 which are inserted into the through-holes 33 and 34 of the wiring board 20. For this reason, the motor 60 can be regarded as an external device having an insertion mounting structure. As a result, the ECU 10 is provided with more through-holes 33 and 34 than a configuration in which a motor having one winding set is driven. Therefore, it is possible to easily provide the ECU 10 with such a configuration that the through-holes 33 and 34 are adjacent to more cut portions 43 and 44, as compared with a configuration in which the motor having one winding set is driven.

The fifth through-hole 35 is provided for the power supply-associated terminal 70 which is provided commonly to (shared by) the first system and the second system. Specifically, the fifth through-holes 35 are provided corresponding to the two power supply-associated terminals 70 which are the power supply terminal and the ground terminal. Therefore, two fifth through-holes 35 are provided in the wiring board 20. The power supply-associated terminal 70 is inserted into the fifth through-hole 35, and the wiring 22 and the power supply-associated terminal 70 are connected to each other. The fifth through-hole 35 is provided on the center line extending in the Y direction on the XY plane of the wiring board 20 because the fifth through-hole 35 is provided commonly to the first system and the second system.

In the above-described manner, the terminals 70, 132, 232, 231, 131 are inserted into the through-holes 31 to 35. Therefore, each of the terminals 70, 132, 232, 231, 131 can be said to be an insertion terminal of an external device.

The present embodiment employs the wiring board 20 in which the five through-hole groups are formed. However, the present disclosure is not limited to this example, as long as the wiring board 20 has at least one through-hole formed therein. In addition, the present disclosure is not limited to the above example with respect to the arrangement of the through-holes 31 to 35 and the like.

Further, the present embodiment employs, as an example, a configuration in which terminals of an external device such as the motor 60 are inserted into the through-holes 31 to 35. However, the present disclosure is not limited to this example. For example, the present disclosure is applicable to a through-hole into which a terminal of a circuit component having an insertion mounting structure to be mounted to the wiring board 20 is inserted. The terminal in this example corresponds to an insertion terminal.

Figure 6:
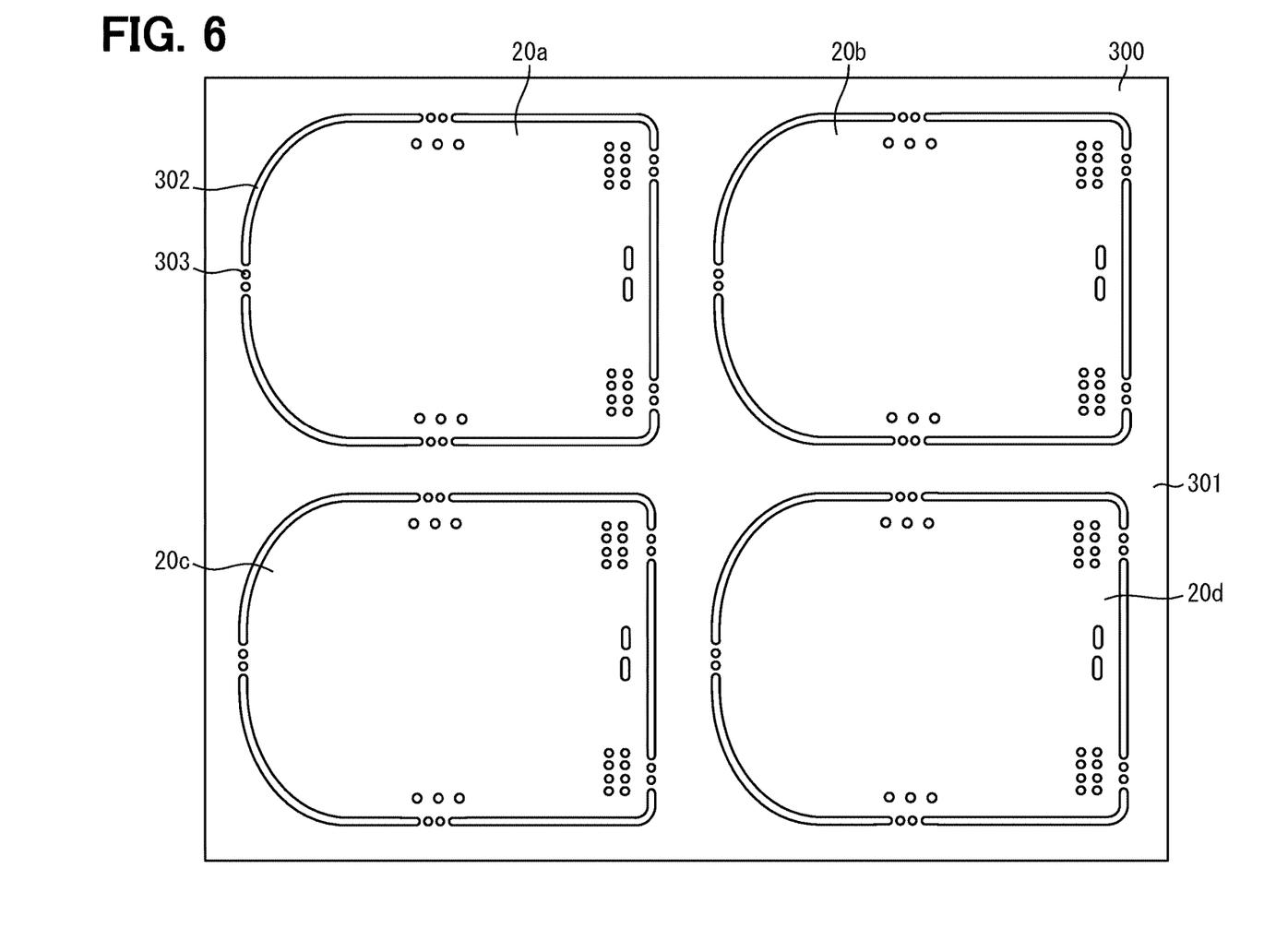
FIG. 6 is a plan view illustrating a schematic configuration of a multi-board providing board according to an embodiment.

Now, a configuration of the multi-board providing board 300 and a method of dividing the multi-board providing board 300 into the wiring boards 20 will be described. As shown in FIG. 6, pre-divided boards 20*a* to 20*b* before the dividing into the wiring boards 20 are formed in the multi-board providing board 300. FIG. 6 is an example of the multi-board providing board 300 in which four pre-divided boards 20a to 20b are formed. However, the number of pre-divided boards 20a to 20b formed in the multi-board providing board 300 is not limited to this example.

In each of the pre-divided boards 20a to 20d, the wiring 22 and the through-holes 31 to 35 are formed in the base member 21. Further, as shown in FIGS. 4 and 5, various circuit components are mounted to each of the pre-divided boards 20a to 20d. In this regard, in FIG. 6, various circuit components are omitted to simplify the drawing.

A base member 301 of the multi-board providing board 300 is provided with the pre-divided boards 20a to 20d. The base member 301 has a first slit 302 and a second slit 303 which are provided around a respective pre-divided board 20a to 20d. Specifically, in the base member 301, a respective pre-division board 20a to 20d and a surrounding of the respective pre-division board 20a to 20d are partially connected to each other. The portion that partially connects the pre-division board 20a to 20d and the surrounding portion are also referred to as a board connection portion.

The second slit 303 is a hole smaller than the first slit 302. The two second slits 303 are formed between the two first slits 302. Therefore, in the base member 301, the pre-division board 20a to 20d and the surrounding portion are connected at a portion between the first slit 302 and the second slit 303 and a portion between the two second slits 303. The present embodiment employs the above slits 302 and 303 as an example. However, the present disclosure is not limited to this example. The number of slits and the shame of the slit different from the above example are employable.

By cutting the multi-board providing board 300 at the board connection portion, a respective pre-divided boards 20a to 20d and its surrounding portion are separated from each other and the wiring board 20 is provided. The partially connected portion can be cut by, for example, a router. The present embodiment employs, as an example, a method of dividing the multi-board providing board 300 into a plurality of wiring boards 200 by a router. However, the present disclosure is not limited to this example. The present disclosure is applicable to a method in which the multi-board providing board is bent at a perforation or a V-cut provided in the multi-board providing board and divided.

As shown in FIG. 1, the wiring board 200 provided by the dividing of the multi-board providing board 300 has cut portions 41 to 45 at a plurality of locations. Specifically, in the side walls of the wiring board 200, cut portions 41 to 45 are formed at which the cutting is performed to divide the multi-board providing board 300. It can be said that the cut portions 41 to 45 are formed at the end portions (side surfaces) of the wiring board 200. The side walls of the wiring board 200 provide an annular surface continuous with the motor-side surface S1 and the cover-side surface S2.

Each of the cut portions 41 to 45 includes a portion protruding from a surrounding portion. Specifically, the cut portion 41 to 45 including the portion where the side wall partly protrudes is formed in the wiring board 200. In each cut portion 41 to 45, a portion corresponding to the board connection portion protrudes from a portion corresponding to the slits 302 and 303. Therefore, each cut portion 41 to 45 includes three protrusion. In the cut portion, a respective protrusion protrudes more than a region next to the respective protrusion.

The configuration of a respective cut portion 41 to 45 is not limited to the above example. The present disclosure is applicable to a cut portion including only two protrusions, to a cut portion including four or more protrusions, to a cut portion including only one protrusion, and the like. That is, the present disclosure is a cut portion including a plurality of protrusions or a cut portion including only one protrusion. Further, the present disclosure is applicable to a cut portion that has no protrusion. Specifically, the present disclosure is applicable to a cut portion including a removed portion, which removed portion is provided by removing a protrusion given at the dividing of the multi-board providing board 300.

The first cut portion 41 is provided adjacent to the first through-hole 31. The second cut portion 42 is provided adjacent to the second through-hole 32. The third cut portion 43 is provided adjacent to the third through-hole 33. The fourth cut portion 44 is provided adjacent to the fourth through-hole 34. Only the fifth cut portion 45 is provided not adjacent to the through-holes 31 to 35.

The first cut portion 41 and the second cut portion 42 are provided on the same side of the wiring board 200. The third cut portion 43 and the fourth cut portion 44 are provided on opposing sides of the wiring board 200. The fifth cut portion 45 is provided on the side of the wiring board 200 opposite to the side where the first cut portion 41 and the second cut portion 42 are provided. However, the positions of the cut portions 41 to 45 are not limited to the above example.

Further, in the wiring board 200, the through-hole 31 to 34 is provided adjacent to the cut portion 41 to 44 without arranging the circuit components between the through-hole 31 to 34 and the cut portion 41 to 44. More specifically, the first through-hole 31 is provided adjacent to the first cut portion 41 without arranging the circuit components between the first through-hole 31 and the first cut portion 41. The second through-hole 32 is provided adjacent to the second cut portion 42 without arranging the circuit components between the second through-hole 32 and the second cut portion 42. The third through-hole 33 is provided adjacent to the third cut portion 43 without arranging the circuit components between the third through-hole 33 and the third cut portion 43. The fourth through-hole 34 is provided adjacent to the fourth cut portion 44 without arranging the circuit components between the fourth through-hole 34 and the fourth cut portion 44.

Specifically, in the wiring board 200, in the Y direction, no circuit component is arranged between the first through-hole 31 and the first cut portion 41. In the Y direction, no circuit component is arranged between the second through-hole 32 and the second cut portion 42. In the wiring board 200, in the X direction, no circuit component is arranged between the third through-hole 33 and the third cut portion 43. In the X direction, no circuit component is arranged between the fourth through-hole 34 and the fourth cut portion 44. In this manner, in the wiring board 200, the through-holes 31 to 34 are provided proximity to the cut portions 41 to 44.

In the ECU 10, the through-hole 31 to 34 is formed adjacent to the cut portion 41 to 44 without arranging the circuit component between the through-hole 31 to 34 and the cut portion 41 to 44. Specifically, in the ECU 10, the through-hole 31 to 34 is formed in a portion where stress is likely applied in dividing the multi-board providing board 300 into the wiring board 20.

For this reason, at a portion where the stress is likely applied due to the dividing, in other words, at a portion where it is difficult to mount a circuit component having a surface mounting structure, it is possible to insert a respective terminal 131, 231, 132, 232 into the through-hole 31 to 34 to connect to the wiring 22. As described above, the terminal 132, 232, and 70 is a terminal of a connector serving as an external device having an insertion mounting structure. On the other hand, the terminal 131 and 231 is a terminal of the motor 60 serving as an external device having an insertion mounting structure. Therefore, in the ECU 10, at a portion where the stress due to the dividing is likely applied, it is possible to mount the connector and/or the motor 60 serving as an external device having the insertion mounting structure.

Alternatively, an insertion terminal of a circuit component having an insertion mounting structure may be inserted into the through-hole 31 to 34. In this case, in the ECU 10, at a position where it is difficult to mount the circuit component having the surface mounting structure, it is possible to insert the insertion terminal of the circuit component having the insertion mounting structure into the through-hole 31 to 34 to connect to the wiring 22.

The connection structure in which the terminal is inserted into the through-hole 31 to 34 to make the connection has a larger stress tolerance with regard to the stress of the wiring board 20 than a connection structure in which a connection structure of a circuit component having the surface mounting structure. Therefore, the ECU 10 can effectively use the portion where it is difficult to mount the circuit component having the surface mounting structure, and therefore, it is possible to increase an effective mounting area in the wiring board 20.

In addition, because the ECU 10 can increase the effective mounting area on the wiring board 20, it is possible to reduce the size of the wiring board 20. Furthermore, at a position where it is difficult to mount a circuit component having a surface mounting structure, it is possible to mount a circuit component having an insertion mounting structure and/or an external device to the wiring board 20 but the circuit component having the surface mounting structure is not mounted. Therefore, in the ECU 10, it is possible to suppress degradation of quality of a solder portion provided to the wiring board 20, and it is possible to ensure a product lifetime.

The preferred embodiment of the present disclosure has been described above. However, embodiments of the present disclosure are not limited to the above embodiment and various modifications are possible without departing from the spirit and scope of the present disclosure. In the below, modification examples will be described as other embodiments of the present disclosure. Each of the above embodiment and modification examples are implementable alone, and further, appropriate combinations of the above embodiment and modification examples are implementable. Embodiments of the present disclosure are not limited to modifications explicitly described but include various combinations.

(Modifications)

Figure 8:
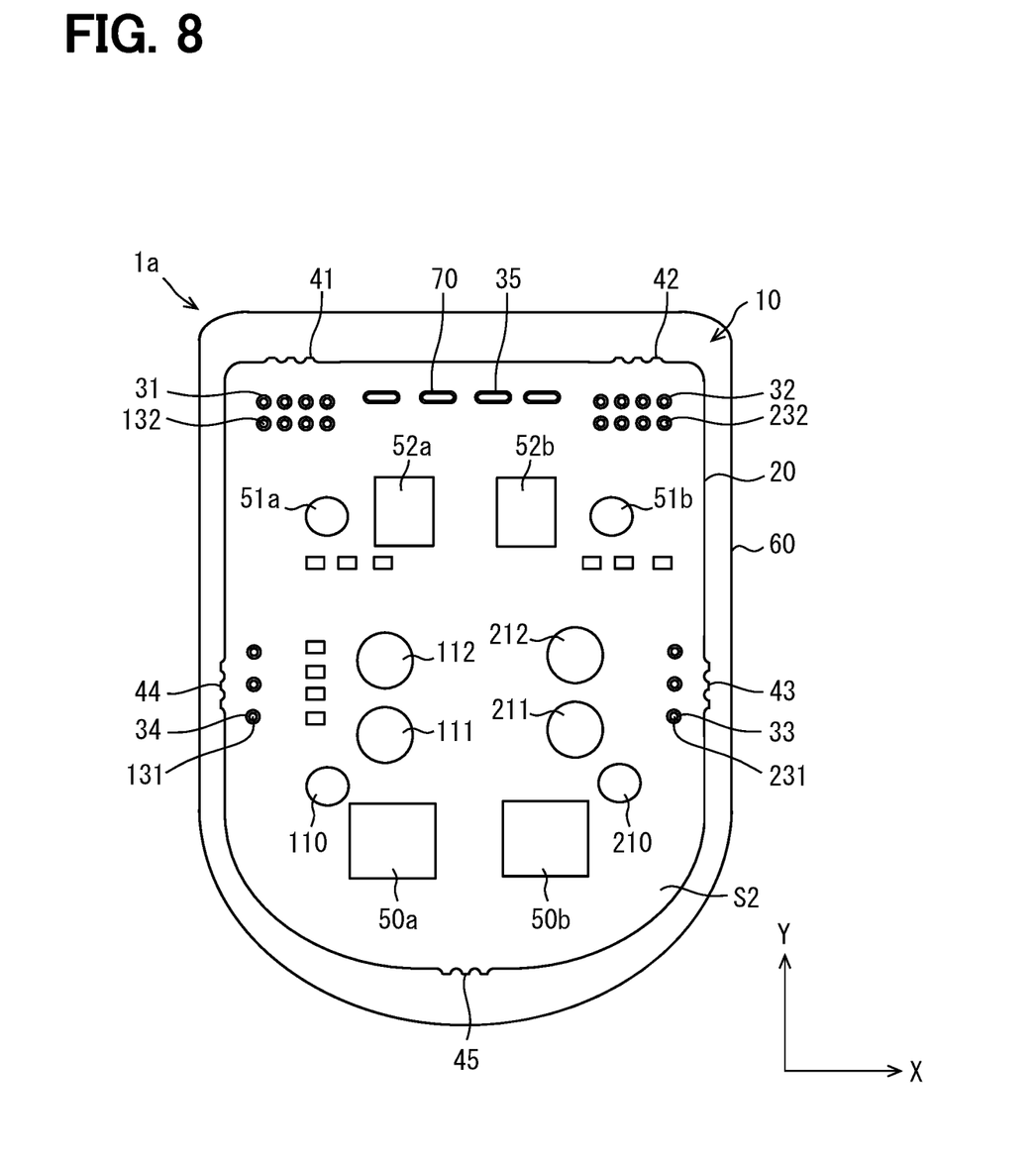
FIG. 8 is a plan view illustrating a schematic configuration of an electronic control unit according to a modification example.

As shown in FIG. 8, a drive device 1a according to a modification example includes an ECU 10a having a completely redundant configuration. The ECU 10a includes the wiring board 20 to which a first CPU 50a, a first capacitor 51a, and a first coil 52a are mounted for the first system, and to which a second CPU 50b, a second capacitor 51b, and a second coil 52b are mounted for the second system. In the ECU 10a, as for the ASIC 53, an ASIC for the first system and an ASIC for the second system are mounted to the motor-side surface S1 of the wiring board 20. Therefore, the wiring board 20 includes a drive circuit for the first system and a drive circuit for the second system as a plurality of drive circuits for driving the motor 60.

Further, the wiring board 20 has four fifth through-holes 35 for the power supply-associated terminals 70 at four locations. Into two of the fifth through-holes 35, a power terminal and a ground terminal corresponding to the drive circuit for the first system (also called a first drive circuit) are inserted to make the connection. Into the other two of the fifth through-holes 35, a power terminal and a ground terminal corresponding to the drive circuit for the second system (also called a second drive circuit) are inserted to make the connection. It is noted that with regard to the completely redundant configuration, configurations described in US2016/0094175A1 corresponding to JP 2016-73098A and JP 2019-21605A corresponding to WO2019017308A, which are incorporated herein by reference, are applicable to configurations of the present disclosure. The ECU 10a configured as described above can provide the same technical effects as the ECU 10.

What is claimed is:

1. An electronic apparatus comprising:
   a wiring board including:
      a base member having an electrically insulating property and having a front surface and a back surface;
      a wiring having an electrically conductive property and arranged to the base member; and
      at least one through-hole penetrating from the front surface to the back surface of the base member, wherein part of the wiring is arranged to the through-hole,
      wherein the wiring board is provided by dividing a multi-board providing board into the wiring board; and
   at least one circuit component having a surface mounting structure, mounted to the wiring board, and electrically connected to the wiring,
   wherein:
   a side wall of the wiring board has a cut portion that is provided when cutting and dividing the multi-board providing board; and
   in the wiring board, the through-hole is formed adjacent to the cut portion without arranging the circuit component between the cut portion and the through-hole.

2. The electronic apparatus according to claim 1, wherein the circuit component mounted to the wiring board constitutes at least one drive circuit for driving a motor; and
   in the through-hole, a terminal for the motor is inserted.

3. The electronic apparatus according to claim 2, wherein:
   the motor includes a plurality of winding sets;
   the at least one drive circuit includes a plurality of drive circuits;
   the at least one circuit component mounted to the wiring board constitutes the plurality of drive circuits provided for the plurality of winding sets, respectively;
   the terminal includes a plurality of winding terminals connected to a plurality of windings of each winding set; and
   the at least one through-hole includes a plurality of through-holes into which the plurality of winding terminals are inserted.

4. The electronic apparatus according to claim 3, wherein the plurality of drive circuits for driving the motor include a first drive circuit and a second drive circuit; and
   the at least one through-hole further includes
   a through-hole into which a power supply terminal corresponding to the first drive circuit is inserted, a through-hole into which a ground terminal corresponding to the first drive circuit is inserted,
a through-hole into which a power supply terminal corresponding to the second drive circuit is inserted, and
a through-hole into which a ground terminal corresponding to the second drive circuit is inserted.

5. The electronic apparatus according to claim 1, wherein the cut portion has a protrusion that protrudes more than a region next to the protrusion in the cut portion.

* * * * *